United States Patent
Nakamura

(10) Patent No.: US 6,947,335 B2
(45) Date of Patent: Sep. 20, 2005

(54) SEMICONDUCTOR DEVICE WITH AN INPUT/OUTPUT INTERFACE CIRCUIT FOR A BUS

(75) Inventor: Hirotsugu Nakamura, ChItose (JP)

(73) Assignees: Renesas Technology Corp., Tokyo (JP); Hitachi ULSI Systems Co., Ltd., Tokyo (JP)

( * ) Notice: Subject to any disclaimer, the term of this patent is extended or adjusted under 35 U.S.C. 154(b) by 128 days.

(21) Appl. No.: 10/256,025

(22) Filed: Sep. 27, 2002

(65) Prior Publication Data

US 2003/0107909 A1 Jun. 12, 2003

(30) Foreign Application Priority Data

Oct. 19, 2001 (JP) .................................. 2001-321298

(51) Int. Cl.[7] .................... H03K 19/0175; G06F 13/14
(52) U.S. Cl. .................... 365/189.03; 326/82; 326/86; 326/88; 710/305
(58) Field of Search .................... 365/189.03, 221, 365/189.12; 710/105, 119, 315, 305; 326/82, 86, 88

(56) References Cited

U.S. PATENT DOCUMENTS

| | | | |
|---|---|---|---|
| 4,689,740 A | 8/1987 | Moelands et al. | 364/200 |
| 5,790,526 A | 8/1998 | Kniess et al. | 370/257 |
| 6,253,268 B1 * | 6/2001 | Bjorkengren et al. | 710/105 |
| 6,339,806 B1 * | 1/2002 | Foster et al. | 710/313 |

* cited by examiner

Primary Examiner—Anh Phung
Assistant Examiner—J. H. Hur
(74) Attorney, Agent, or Firm—Miles & Stockbridge PC

(57) ABSTRACT

There is provided a control circuit which instructs, using a control signal, validation and invalidation of operations of an input/output interface circuit suitable for a bus such as the IIC bus and maintains an output element included in the input/output interface circuit to the OFF stage without relation to voltage change at the external terminal corresponding to the input/output interface circuit in response to invalidation of operation due to the control signal. Accordingly, a semiconductor device which can be used flexibly with a simplified structure and prevents erroneous output in the output circuit corresponding to the IIC bus can be obtained.

18 Claims, 9 Drawing Sheets

SEMICONDUCTOR DEVICE WITH AN INPUT/OUTPUT INTERFACE CIRCUIT FOR A BUS

BACKGROUND OF THE INVENTION

The present invention relates to a semiconductor device and more particularly to a technique which can be effectively adapted to a semiconductor device provided with an input/output interface circuit suitable for a bus such as IIC bus.

An output circuit of a certain kind is required to conduct an operation to restrict signal variation speed such as rising rate or falling rate of an output signal for the suitable operation of a circuit system using the same output circuit, and therefore it is required for such output circuit to introduce a circuit structure suitable to such requirement. A circuit for the IIC bus which has been proposed by the Philips Corp. is provided with a restriction of this kind. The IIC bus is formed of a serial data line (SDA) and a serial clock line (SCL). Therefore, coupling among the less number of lines between the circuit systems becomes possible. IIC($I^2C$) is the trade mark of the Philips Corp. The U.S. Pat. Nos. 5,790,526 and 4,689,740 describe a circuit in relation to the IIC bus.

SUMMARY OF THE INVENTION

The inventors of the present invention have thought, as illustrated in FIG. 10, to couple an output circuit 2 corresponding to the IIC bus and the other output circuit 1 to output the other specification level, for example, under the structure that these circuits are mounted on one semiconductor device, based on the following technical point of view.

Namely, a bus such as the IIC bus has been set under the particular specifications and it is desirable, from the viewpoint of the property of bus, this bus can be used also as the other kind of bus. It is because the matching with the existing product design resources, products or the existing technique such as existing electronic system can be increased in the development of electronic systems. Meanwhile, when the IIC bus allows only the corresponding exclusive circuit, it can no longer be adapted to the system of the other interface. On the contrary, when a circuit such as an output circuit for the particular bus other than that corresponding to the IIC bus is formed, there rises a restrictive situation that this circuit cannot be used for the system corresponding to the IIC bus for such particular bus.

Possibility for setting of the common bus for the circuits of different kinds will be apparent from the following viewpoints. Namely, it is only a rare case that the interface circuits of different kinds are operated simultaneously on the system. Therefore, the operation control is possible to select the first operation mode in which the predetermined control signal, for example, invalidates an output of the output circuit 2 corresponding to the IIC bus and validates an output of the other signal output circuit 1 and the second operation mode in which the predetermined control signal validates an output of the output circuit 2 corresponding to the IIC bus and invalidates an output of the other signal output circuit 1.

In above first operation mode, an input signal S2 of the output circuit 2 corresponding to the IIC bus is fixed to a high level such as the power source voltage VCC. Therefore, potential of an output signal VA of a drive circuit becomes GND (0V), while an N-channel type output MOSFET Q1 of an open-drain structure becomes OFF, resulting in an output of high impedance. Accordingly, an output signal S3 corresponding to the other signal output circuit 1 to receive the input signal S1 can be outputted from the common I/O terminal.

In the output circuit 2 corresponding to the IIC bus, a Miller capacitor C is provided, for falling slope control of an output signal thereof, between the gate and drain of output MOSFET Q1, and a resistor R is also provided between an output VA of the drive circuit and the gate of MOSFET Q1. It has been made obvious, by reviewing the circuit based on the present invention that following problems are generated when the operation mode is selected in such circuit structure to the first operation mode in which an output of the output circuit 2 corresponding to the IIC bus is set invalid, while an output of the other signal output circuit 1 is set valid.

FIG. 11 illustrates operation waveforms in the first operation mode explained above. The signal S2 is fixed to a high level such as VCC. Accordingly, an output signal VA of the drive circuit is fixed to a low level such as GND. When an input signal S1 changes to the GND level from VCC under this condition, an output signal S3 changes to a high level from the low level. With change of this signal S3 to the high level, a gate voltage VB of the output MOSFET Q1 is raised as much as ΔVB through capacitance coupling in the Miller capacitor C. Rise ΔVB of this gate voltage is finally discharged to the VA potential in the GND level via the resistor R, requiring a reasonable time.

Therefore, the gate voltage VB of the output MOSFET Q1 is raised as much as ΔVB exceeding a threshold value voltage Vth immediately after the change of the signal S1 to the GND level from the VCC level, this output MOSFET Q1 is undesirably turned OFF even when the potential VA is in the low level. As a result, the signal S3 dropped when the MOSFET Q1 turns ON is outputted from an I/O terminal for the desired voltage VCC formed by the output circuit 1, resulting in the possibility for erroneous operation within a receiver which receives an output.

An object of the present invention is therefore to provide a semiconductor device which is formed in the simplified structure assuring higher flexibility for use. Another object of the present invention is to provide a semiconductor device including an output circuit to be coupled with circuits having different characteristics. Further object of the present invention is to provide a semiconductor device which prevents undesirable influence on a bus line of an output circuit in the structure which restricts signal changing rate. The aforementioned and other object's and novel features of the present invention will become apparent from description of the present specification and the accompanying drawings.

The typical inventions of the present invention will be briefly explained below. An output circuit to give a signal to a bus line includes a changing rate limiting element to limit a changing rate of the output signal. Here, a control signal is set to control limitation of a changing rate of an output signal depending on the changing rate limiting element. In one level condition of the control signal, the limiting operation is effectively executed with the changing rate limiting element and an output signal is changed in the limited changing rate. Under the other level condition of the control signal, the limiting operation by the changing rate limiting element is controlled or invalidated. In such other level condition of the control signal, the signal may be changed not depending on the changing rate limiting element.

The IIC bus is considered as an adequate bus and an output circuit for this bus has a changing rate limiting element consisting of a capacitance element. With the other level condition of the control signal, the changing rate limiting operation of the output signal by the capacitance element is controlled or invalidated.

DETAILED DESCRIPTION OF THE PREFERRED EMBODIMENTS

Figure 1:
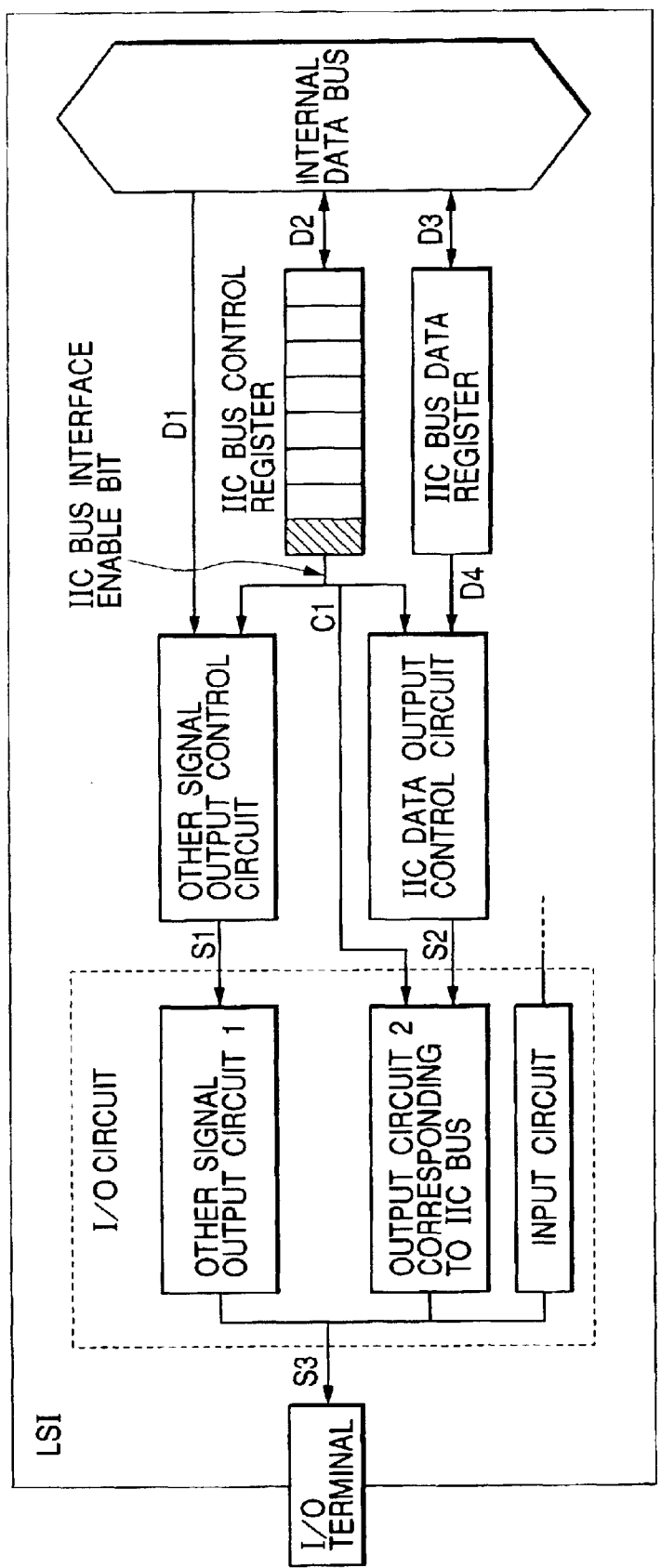
FIG. 1 is a block diagram illustrating an embodiment of an interface of a semiconductor device of the present invention.

FIG. 1 illustrates an embodiment of an interface of the semiconductor device of the present invention. In this embodiment, an I/O (input/output) circuit including an output circuit 2 corresponding to the IIC bus and the other signal output circuit 1 outputting the other specification level is provided. The input/output terminal I/O is used in common for the two output circuits 1 and 2 in order to save the number of external terminals. The IIC bus executes exchange of data using two lines of serial clock line SCL and serial data line SDL. The I/O terminal and input/output circuit connected thereto are provided corresponding to the serial data line SDL.

The output circuit 2 corresponding to the IIC bus forms, in combination with an input circuit, an input/output interface circuit of the IIC bus. The output circuit 2 corresponding to the IIC bus outputs a signal S2 formed by the IIC data output control circuit. Although not particularly restricted, the data (address) D3 of 8 bits transferred to an internal data bus is inputted in parallel to the IIC bus data register. The data (address) fetched with the IIC bus data register is then transferred to a IIC data output control circuit. In this IIC data output control circuit, the serial data D4 outputted from the IIC bus data register is transferred to the output circuit corresponding to the IIC bus and the start and stop conditions for IIC bus control are generated in relation to the clock.

An IIC bus control register is originally provided corresponding to the IIC bus, and 6 bits thereof are used for controlling the relevant device LSI to be used as a master or a slave and controlling whether interruption is allowed or not. Therefore, in this embodiment, one bit is added as the IIC bus interface enable bit to this IIC bus control register by paying attention to the fact that the remaining two bits among 8 bits transferred from the internal data bus are not used. Operations of the IIC bus interface is controlled for validation and invalidation by setting such enable bit.

Namely, in the present invention explained above, mounting to variety of systems can be realized through application to the interfaces corresponding to the IIC bus and the other desired one by mounting the output circuit 2 corresponding to the IIC bus and the other signal output circuit 1 to output the other specification level on one semiconductor device LSI. The interface corresponding to the IIC bus and the other desired one is not almost used simultaneously in parallel and two circuits are connected in common to one external terminal I/O in order to save the number of external terminals. The control signal C1 corresponding to the IIC bus interface enable bit enables selection of the first operation mode in which an output of the output circuit 2 corresponding to the IIC bus is invalidated and an output of the other signal output circuit 1 is validated and the second operation mode in which an output of the output circuit 2 corresponding to the IIC bus is validated and an output of the other signal output circuit 1 is invalidated.

The other signal output control circuit 1 receives, although not particularly restricted, a data D1 transferred through an internal data bus when operation of the other output circuit 1 is validated with the control signal C1 in order to form a signal S1 transferred to the other signal output circuit 1. Although not particularly restricted, it is also allowed that a data register such as the IIC bus data register is provided to receive in parallel the data of a plurality of bits such as 8 bits corresponding to the bit width of the internal data bus and such data is then converted into the serial data D1 to transfer it to the other signal output control circuit.

Figure 2:
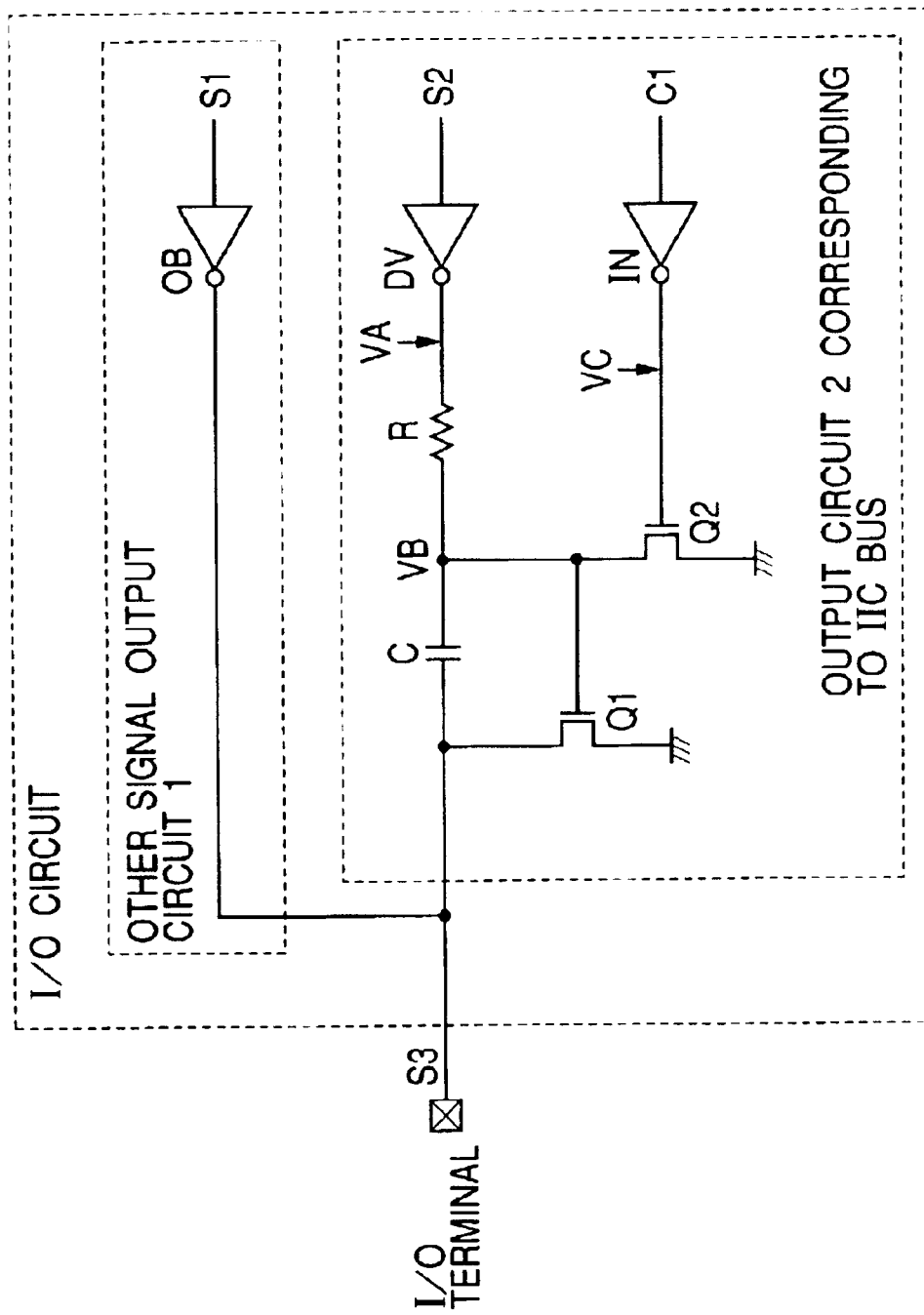
FIG. 2 is a circuit diagram illustrating an embodiment of the other signal output circuit 1 and an output circuit 2 corresponding to the IIC bus in FIG. 1.

FIG. 2 illustrates a circuit diagram as an embodiment of the other signal output circuit 1 of FIG. 1 and the output circuit 2 corresponding to the IIC bus. The other signal output circuit 1 is composed of an output circuit OB and an output terminal is connected to an external terminal I/O. The output circuit 2 corresponding to the IIC bus is composed, conforming to the IIC bus specifications, of an N-channel MOSFET Q1 as an output element in which the ground potential is applied to the source and the drain is connected to the I/O terminal, a Miller capacitor C provided between the drain and gate of the output MOSFET Q1 and a resistor R provided between the gate of the output MOSFET Q1 and an output terminal of a drive circuit DV.

In this embodiment, in order to prevent such erroneous operation executed when operation of the output circuit 2 corresponding the IIC bus is invalidated and operation of the other signal output circuit 1 is validated, a switch MOSFET Q2 is provided to control rise of a gate voltage VB between the gate of the output MOSFET Q1 and the ground potential of the circuit. The MOSFET Q2 is formed of an N-channel type MOSFET and an output signal of an inverter circuit IV to receive the control signal C1 is transferred to the gate of this MOSFET.

An output circuit OB of the other signal output circuit 1 is formed, although not particularly restricted, of a CMOS and its operation is controlled corresponding to the control signal C1. The output circuit OB, when it is in the non-operating condition depending on the level such as the low level of the control signal C1, sets its output MOSFET to the OFF state and its output to a high impedance and thereby its operation is invalidated. In the same manner, in the case of the output circuit 2 corresponding to the IIC bus, the signal S2 becomes high level corresponding to the control signal C1 and an output signal VA of the drive circuit is fixed to a low level. Thereby, the output MOSFET Q1 becomes OFF setting an output to the high impedance. Thereby, its operation is invalidated.

Figure 3:
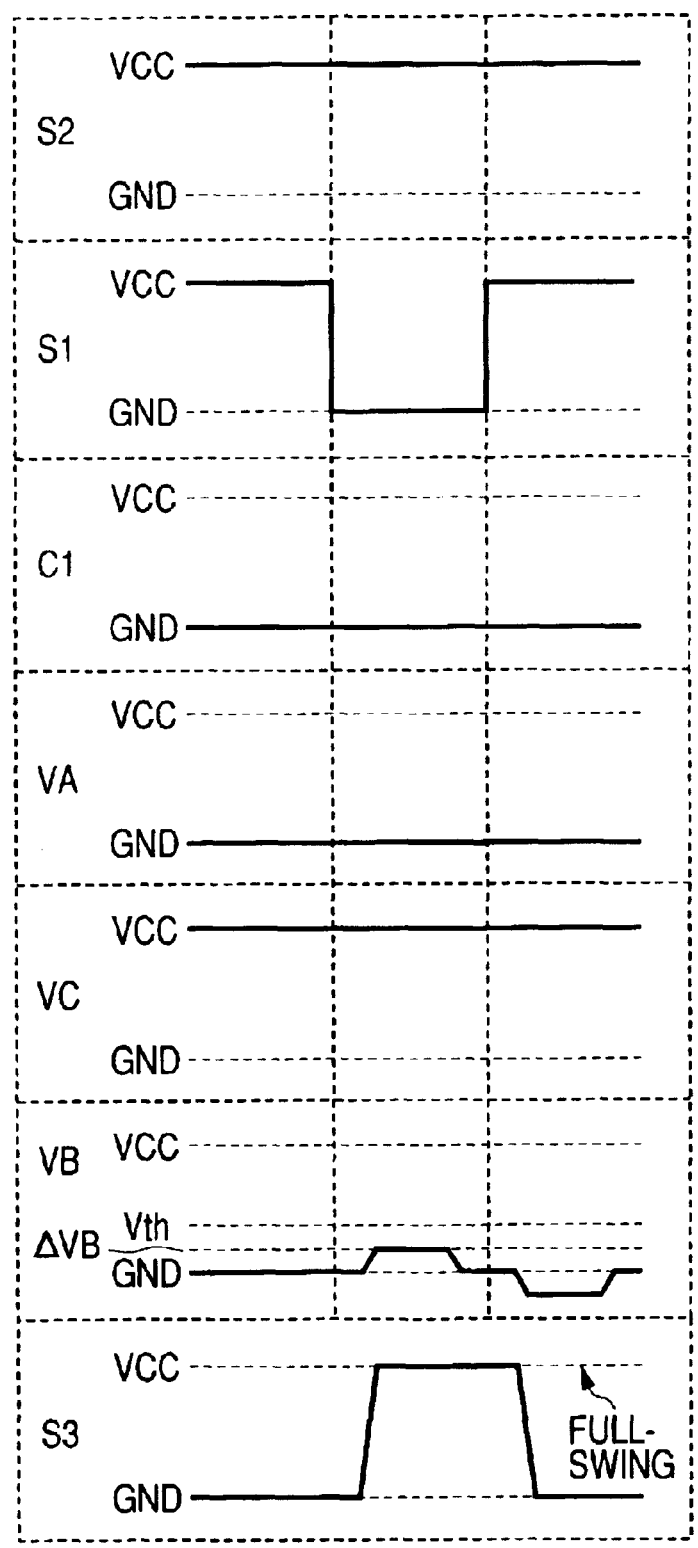
FIG. 3 is a waveform diagram for explaining an example of operations of the output circuit of FIG. 2.

FIG. 3 illustrates waveforms for explaining an example of the operations of the output circuit of FIG. 2. As explained above, the signal S2 is fixed to the high level with the IIC bus interface enable bit of the IIC bus control register and an output of the output circuit corresponding to the IIC bus is invalidated. Namely, when the signal S2 becomes high level, a drive signal VA formed by the drive circuit DV is maintained in the low level and the gate voltage VB of the output MOSFET Q1 is set to the ground potential of the circuit. Therefore, this MOSFET Q1 is turned OFF.

In this case, an output of the other signal output circuit 1 is validated and the signal S1 is outputted from the external terminal I/O. When the signal S1 is in the high level, an output signal of the output circuit OB is set to the low level. Therefore, the output signal S3 outputted from the I/O terminal is in the low level. When the level of signal S1 changes to the GND level from the VCC level under this condition, the output signal S3 tries to change to the high level from the low level. This potential change raises the gate voltage VB of the output MOSFET Q1 as much as $\Delta VB$ via the Miller capacitance C.

In this embodiment, the control signal C1 in the low level corresponding to the IIC bus interface enable bit causes an output signal of the inverter circuit IN to the high level in order to turn ON the switch MOSFET Q1. Therefore, rising quantity $\Delta VB$ of the gate voltage VB is momentarily set to the GND level and the output MOSFET Q1 in the open drain is maintained in the OFF state. Accordingly, a voltage drop of the output signal S3 by the other signal output circuit 1 is not generated and the signal S3 fully swings to the desired voltage.

Since the N-channel type MOSFET Q2 as explained in this embodiment is disposed, the gate of the output MOSFET Q1 of the open drain of the output circuit 2 corresponding to the IIC bus can be controlled. Consequently, the output signal S3 formed by the other signal output circuit 1 fully swings to the desired voltage to improve the DC characteristic of the I/O circuit during the high speed operation. For instance, when an operating voltage VCC is 3V, operating frequency f is 33 MHz, the output VCC level voltage VOH can be improved as much as 0.35V. As explained above, erroneous operation of the receiver connected to the I/O terminal has been prevented by improving the voltage VOH characteristic of the output signal S3 during the high speed operation of the other signal output circuit 1.

Although eliminated in FIG. 3, when an output of the output circuit 2 corresponding to the IIC bus is validated and an output of the other signal output circuit 1 is invalidated with the control signal C1 corresponding to the IIC bus interface enable bit, the control signal C1 is set to the VCC level. Accordingly, an output signal of the inverter circuit IN becomes low level and the N-channel type switch MOSFET Q2 becomes OFF. As a result, since the output circuit 2 corresponding to the IIC bus has a structure corresponding to the IIC bus specification, there is no change in the IIC bus characteristic and the output signal S3 which is placed under the falling slope control determined by the Miller capacitor C and resistor R or the like can be obtained.

Figure 4:
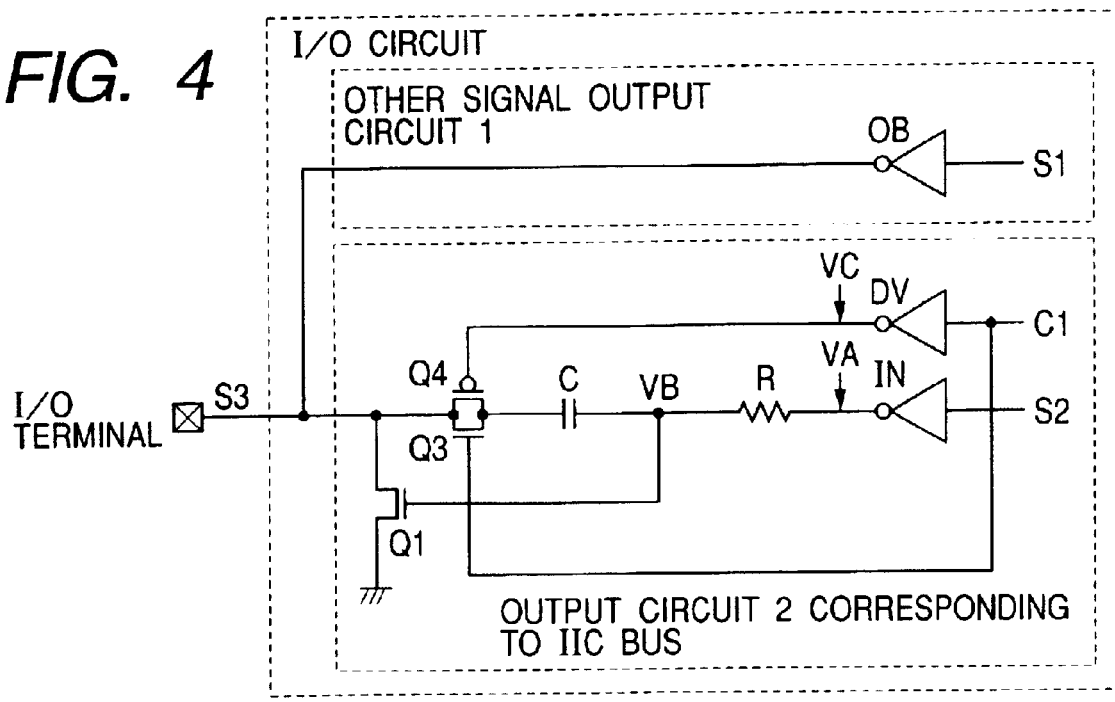
FIG. 4 is a circuit diagram illustrating the other embodiment of the other signal output circuit 1 of FIG. 1 and the output circuit 2 corresponding to the IIC bus.

FIG. 4 illustrates a circuit diagram of the other embodiment of the other signal output circuit 1 of FIG. 1 and the output circuit 2 corresponding to the IIC bus. In this embodiment, a CMOS switch consisting of an N-channel MOSFET Q3 and a P-channel MOSFET Q4 is inserted between the drain of the output MOSFET Q1 and one end of the Miller capacitor C in the output circuit 2 corresponding to the IIC bus. The control signal C1 is supplied to the gate of the N-channel MOSFET Q3 and this control signal C1 is then transferred to the gate of the P-channel MOSFET Q4 through the inverter circuit IN.

As explained above, the signal S2 is fixed to the high level and an output of the output circuit 2 corresponding to the IIC bus is invalidated with the IIC bus interface enable bit of the IIC bus control register, an output of the other signal output circuit 1 is validated. When the level of the signal S1 changes to the GND level from the VCC level, the output signal S3 changes to the high level from the low level. When the control signal C1 corresponding to the IIC bus interface enable bit is in the low level, the N-channel MOSFET Q3 is in the OFF state, an output signal of the inverter circuit IN is set to the high level and the P-channel MOSFET Q4 is turned OFF. Thereby, a transfer route between the Miller capacitor C and the drain of output MOSFET Q1 is cut off.

When such transfer route is cut off, rising quantity $\Delta VB$ of the gate voltage VB is not generated and the gate voltage VB of the output MOSFET Q1 maintains the ground potential corresponding to the low level of the output signal VA of the drive circuit DV. Therefore, the output MOSFET Q1 of open drain maintains its OFF state. As a result, voltage drop is not generated in the output signal S3 by the other signal output circuit 1 and the output signal S3 fully swings to the desired voltage.

When an output of the output circuit 2 corresponding to the IIC bus is validated and an output of the other signal output circuit 1 is invalidated with the control signal C1 corresponding to the IIC bus interface enable bit, the control signal C1 is set to the VCC level. Therefore, the N-channel MOSFET Q3 is turned ON, an output signal of the inverter circuit IN is set to the low level and the P-channel MOSFET Q4 is turned ON. Accordingly, a transfer route between the Miller capacitor C and the drain of output MOSFET Q1 is formed. Therefore, since the output circuit 2 corresponding to the IIC bus has a structure corresponding to the IIC bus specification, there is no change in the IIC bus characteristic and the output signal S3 which is placed under the falling slope control determined by the Miller capacitor C and resistor R or the like can be obtained.

Figure 5:
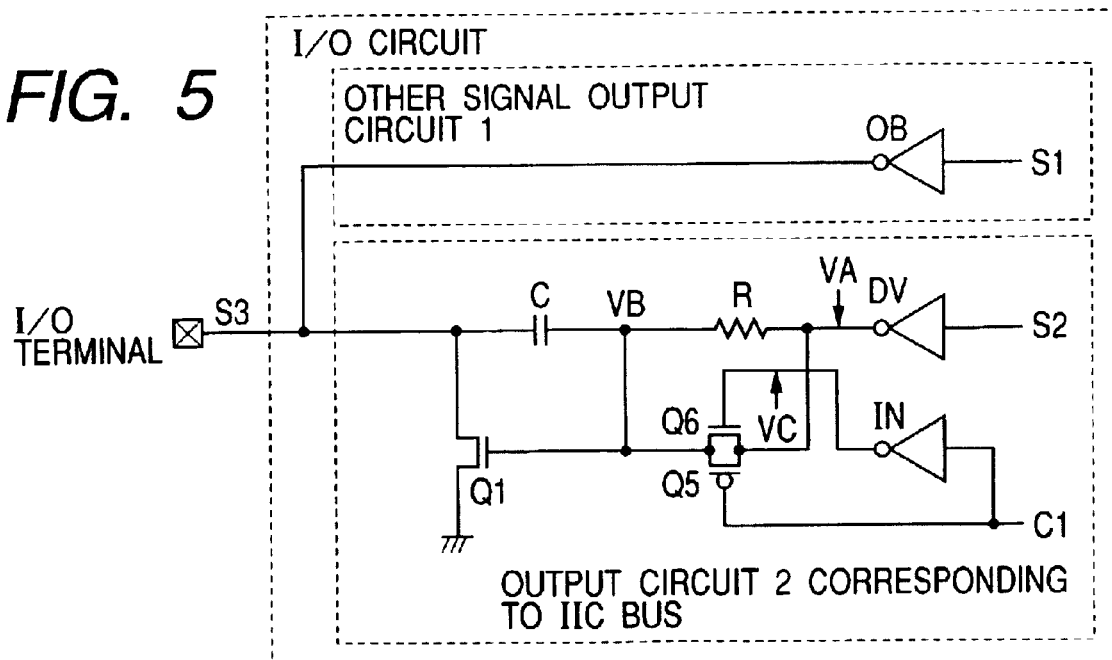
FIG. 5 is a circuit diagram illustrating another embodiment of the other signal output circuit 1 of FIG. 1 and the output circuit 2 corresponding to the IIC bus.

FIG. 5 illustrates a circuit diagram of the other embodiment of the other signal output circuit 1 of FIG. 1 and the output circuit 2 corresponding to the IIC bus. In this embodiment, a CMOS switch consisting of a P-channel MOSFET Q5 and an N-channel MOSFET Q6 is inserted across the resistor R in the output circuit 2 corresponding to the IIC bus. The control signal C1 is supplied to the gate of P-channel MOSFET Q5 and this control signal C1 is also transferred to the gate of the N-channel MOSFET Q6 through the inverter circuit IN.

When the signal S2 is fixed to the high level and an output of the output circuit 2 corresponding to the IIC bus is invalidated with the IIC bus interface enable bit of the IIC bus control register, an output of the other signal output circuit 1 is validated and when the signal S1 changes to the GND level from the VCC level, the output signal S3 also changes to the high level from the low level. When the control signal C1 corresponding to the IIC bus interface enable bit becomes low level, the P-channel MOSFET Q5 is turned ON, an output signal of the inverter circuit IN becomes high level and the N-channel MOSFET Q6 is turned ON. Thereby, both terminals of the resistor R are terminated and this resistor is substantially replaced with a low resistance value.

When the resistor R is terminated, the rising quantity ΔVB of the gate voltage VB momentarily becomes the GND potential corresponding to the output voltage VA of the drive circuit DV through the MOSFET Q5 and Q6 of low resistance value and the output MOSFET Q1 of open drain maintains the OFF state. Therefore, a voltage drop of the output signal S3 due to the other signal output circuit 1 is no longer generated and the output signal S3 fully swings to the desired voltage.

When an output of the output circuit 2 corresponding to the IIC bus is validated and an output of the other signal output circuit 1 is invalidated with the control signal C1 corresponding to the IIC bus interface enable bit, the control signal C1 is set to the VCC level. Therefore, the P-channel MOSFET Q5 is turned OFF, an output signal of the inverter circuit IN is set to the low level and the N-channel MOSFET Q6 is turned OFF. Consequently, the resistor R is inserted in serial to the Miller capacitor C. Accordingly, since the output circuit 2 corresponding to the IIC bus has a structure corresponding to the IIC bus specification, there is no change in the IIC bus characteristic and the output signal S3 which is placed in the falling slope control determined by the Miller capacitor C and resistor R or the like can be obtained.

Figure 6:
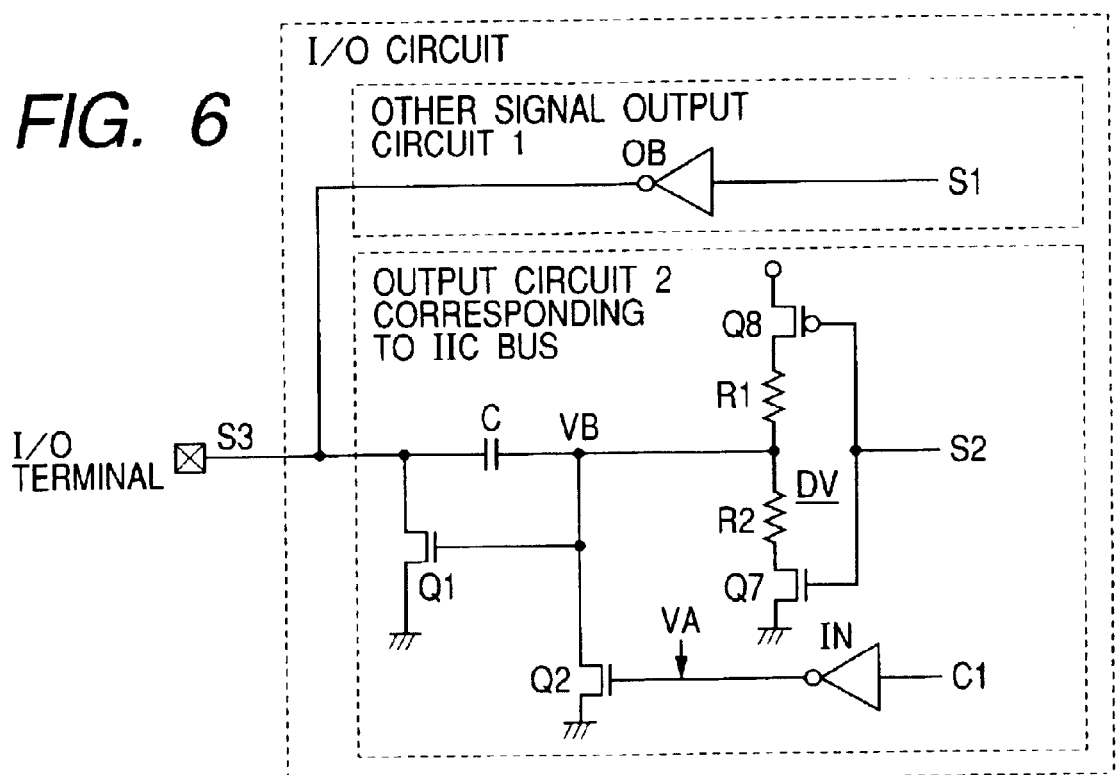
FIG. 6 is a circuit diagram illustrating the other embodiment of the other signal output circuit 1 of FIG. 1 and the output circuit 2 corresponding to the IIC bus.

FIG. 6 illustrates a circuit diagram of the other embodiment of the other signal output circuit 1 of FIG. 1 and the output circuit 2 corresponding to the IIC bus. This embodiment is a modification example of the output circuit 2 corresponding to the IIC bus and the resistor R of the embodiment of FIG. 2 is replaced with resistors R1 and R2. Namely, the resistor R1 is provided between the drain of an N-channel MOSFET Q7 forming the drive circuit DV and the connecting point of the Miller capacitor C and the gate of the output MOSFET Q1 and the resistor R2 between the drain of the P-channel MOSFET Q8 and the connecting point of the Miller capacitor C and the gate of the output MOSFET Q1. These resistors are set to have the resistance values indicated as the resistor R=R1=R2. The other structure is similar to that of the embodiment illustrated in FIG. 2.

Figure 7:
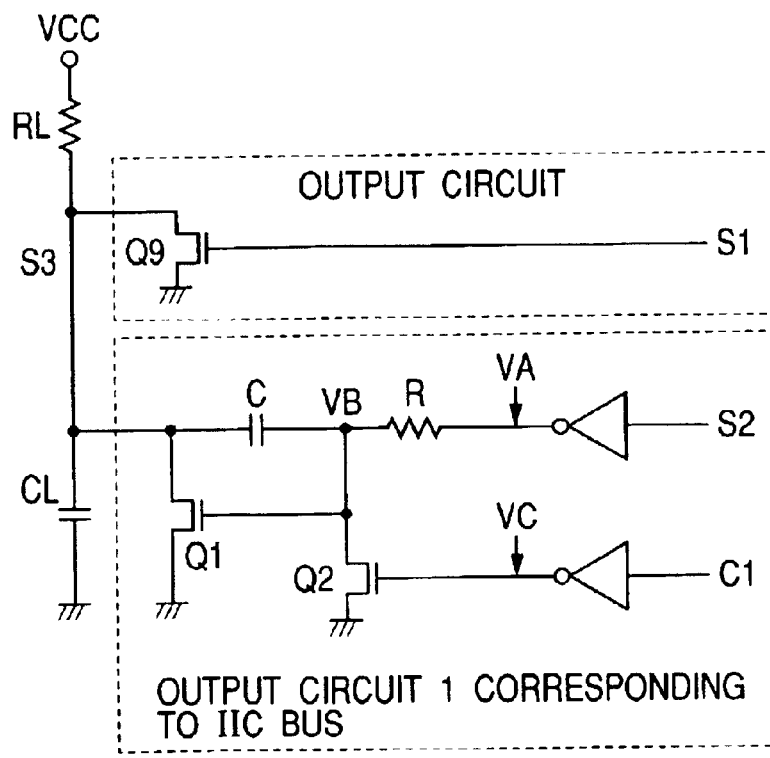
FIG. 7 is a circuit diagram illustrating the other embodiment of the other signal output circuit 1 of FIG. 1 and the output circuit 2 corresponding to the IIC bus.

FIG. 7 illustrates a circuit diagram of the other embodiment of the other signal output circuit 1 of FIG. 1 and the output circuit 2 corresponding to the IIC bus. In this embodiment, a practical circuit of the other signal output circuit is illustrated. The other signal output circuit of this embodiment is formed of an output circuit of open drain consisting of an N-channel MOSFET Q9. When such output MOSFET Q9 of open drain is used, operation of this output circuit may be invalidated by fixing the input signal S1 to the low level as explained above.

As an application example, when the bus is wired in such open drain connection like this embodiment, it can be expected that the output MOSFET Q9 is turned OFF and the output signal S3 is set to the VCC level due to a pull-up resistor RL, if an output of the output circuit 2 corresponding to the IIC bus is invalid, an output of the output circuit is valid and the signal S1 is in the low level. In the circuit where the N-channel MOSFET Q2 is not added to the output circuit corresponding to the IIC bus, the output MOSFET Q1 of open drain is unexpectedly turned ON due to the coupling with the Miller capacitor C, resulting in the problem that the output signal S3 is dropped against the desired voltage.

Figure 8:
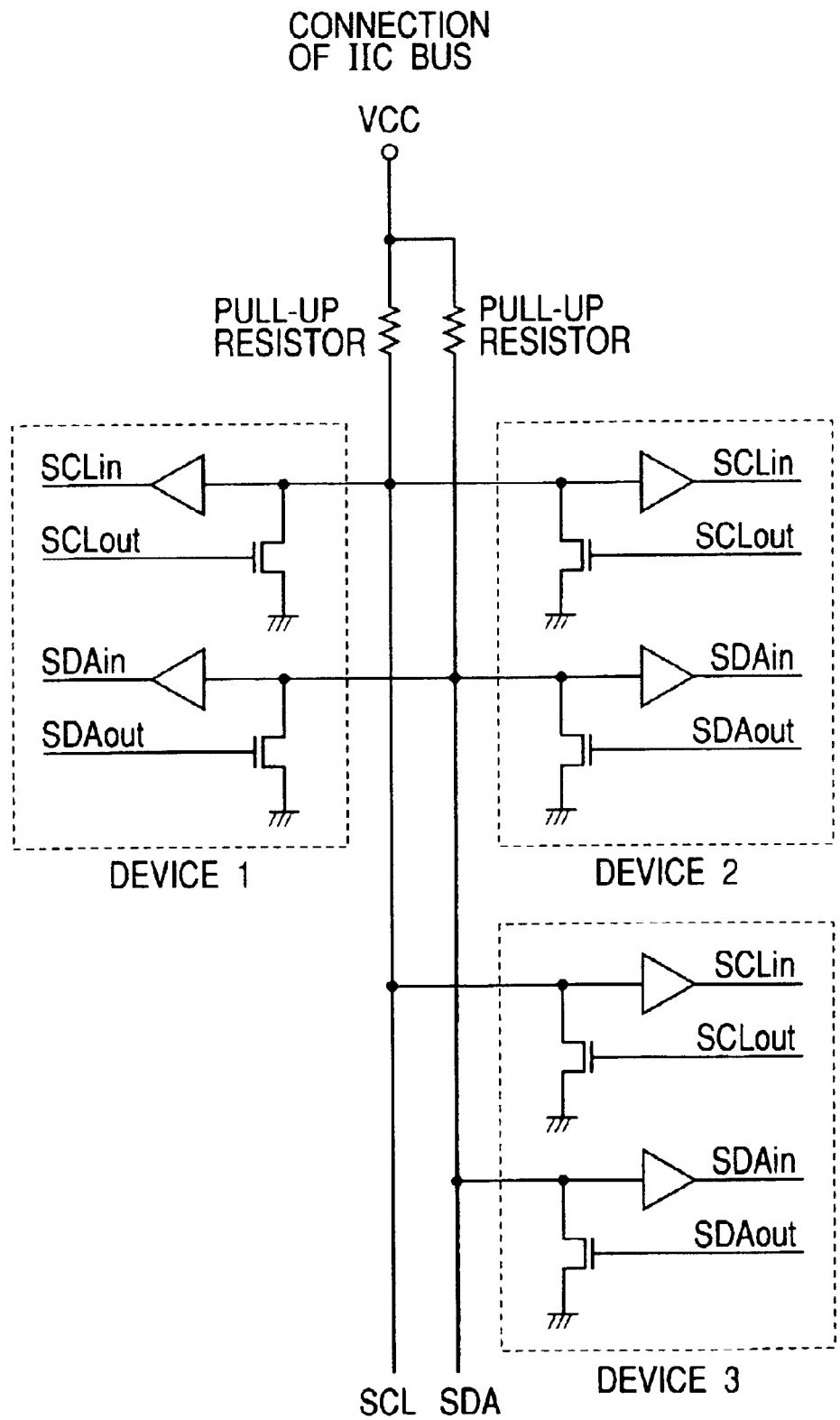
FIG. 8 is an IIC bus connection diagram for explaining an embodiment of the present invention.

FIG. 8 illustrates a IIC bus connection diagram for explaining an embodiment of the present invention. In this embodiment, operation of the other signal output circuit is invalidated as explained above with the control signal C1 and a system using the IIC bus is formed. Namely, the serial clock line SCL and serial data line SDL are provided with a pull-up resistor and are connected with a plurality of devices 1 to 3. One of these devices 1 to 3 is defined as a mater device, while the others as slave devices with the setting of the IIC bus control register. In the procedures determined by the IIC bus specification, the master device obtains the IIC bus and transmits the address and data of the slave devices in synchronization with the serial clock. The address and data are formed in unit of 8 bits and an acknowledge ACK of one bit is inserted in every transfer of address and data.

As explained above, it is possible to form the system corresponding to the IIC bus and to perform transfer of data in the other signal level other than that corresponding to IIC bus using the same devices 1 to 3. Actually, when a system is to be formed, the bus used in this system is determined to the IIC bus or the other bus, except for the case where particular merit exists when the data transfer is executed corresponding to the IIC bus in a certain period and the data transfer is executed using the other signal output circuit in the other period in the same devices 1 to 3.

On the occasion of using the semiconductor device of this embodiment, a plurality of devices having the interface corresponding to the IIC bus of the present invention and a plurality of devices having only the other input/output interfaces can also be connected to the common bus. In this case, the bus is used on the time division basis in such a manner that the data exchange is conducted in a plurality of devices having the interfaces corresponding to the IIC bus and the data exchange is conducted in a plurality of devices having the other input/output interfaces. When the data exchange is executed in a plurality of devices having the input/output interfaces other than the IIC bus, an output element of the interface corresponding to the IIC bus of the present invention is never erroneously turned ON with the other signal output operation due to the Miller capacitor as explained above. Therefore, it does not give any interference on the data exchange in a plurality of devices having the input/output interfaces other than the IIC bus.

Figure 9:
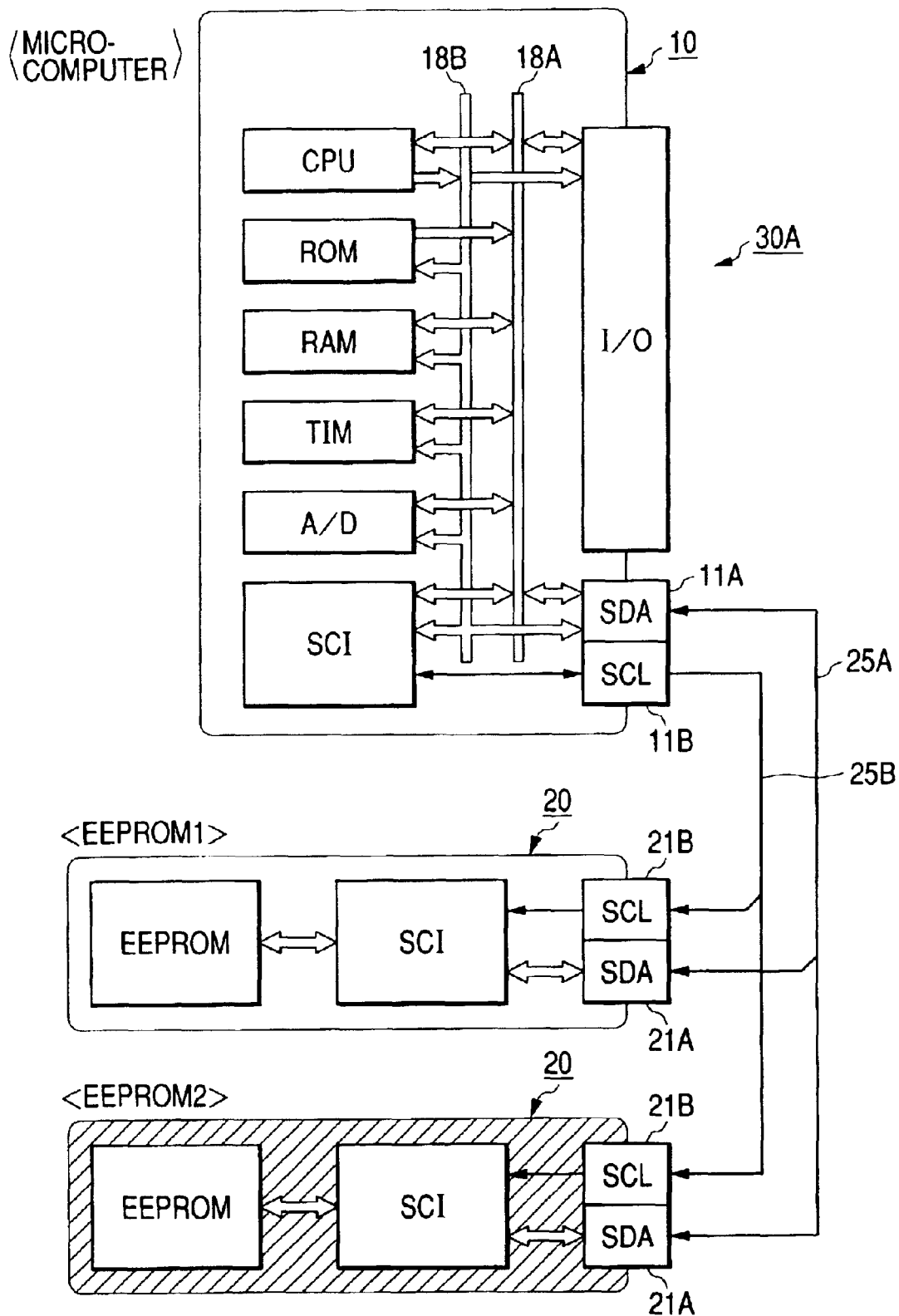
FIG. 9 is a block diagram illustrating an embodiment of an information processing system of the present invention.
Figure 10:
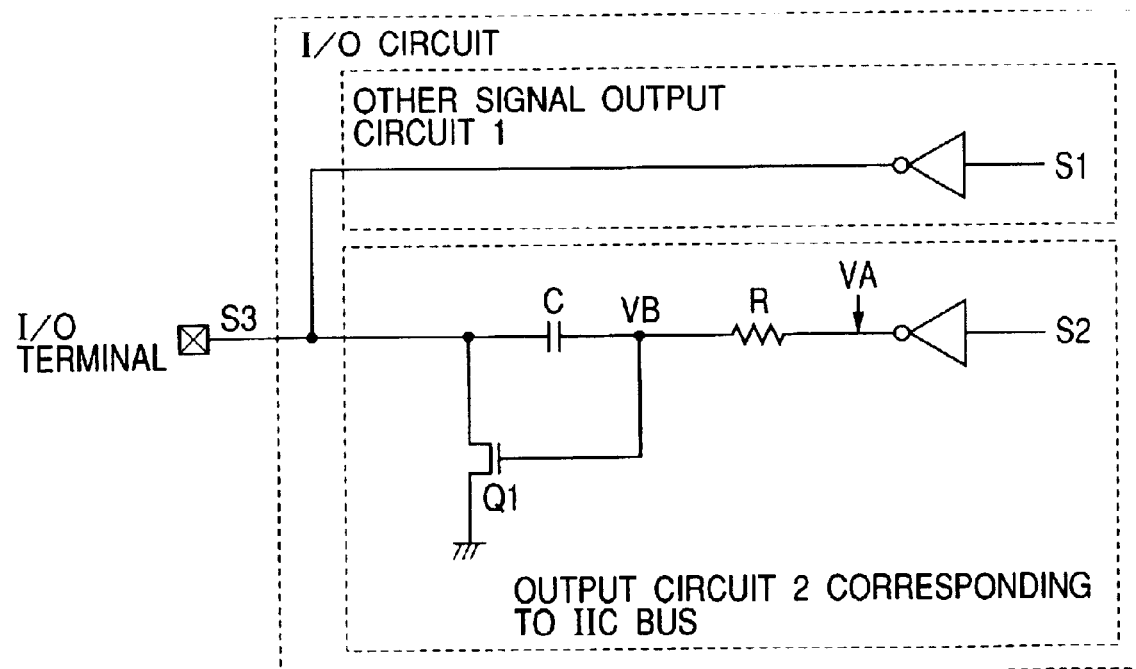
FIG. 10 is a circuit diagram of the interface of the semiconductor device investigated previously by the inventors of the present invention.
Figure 11:
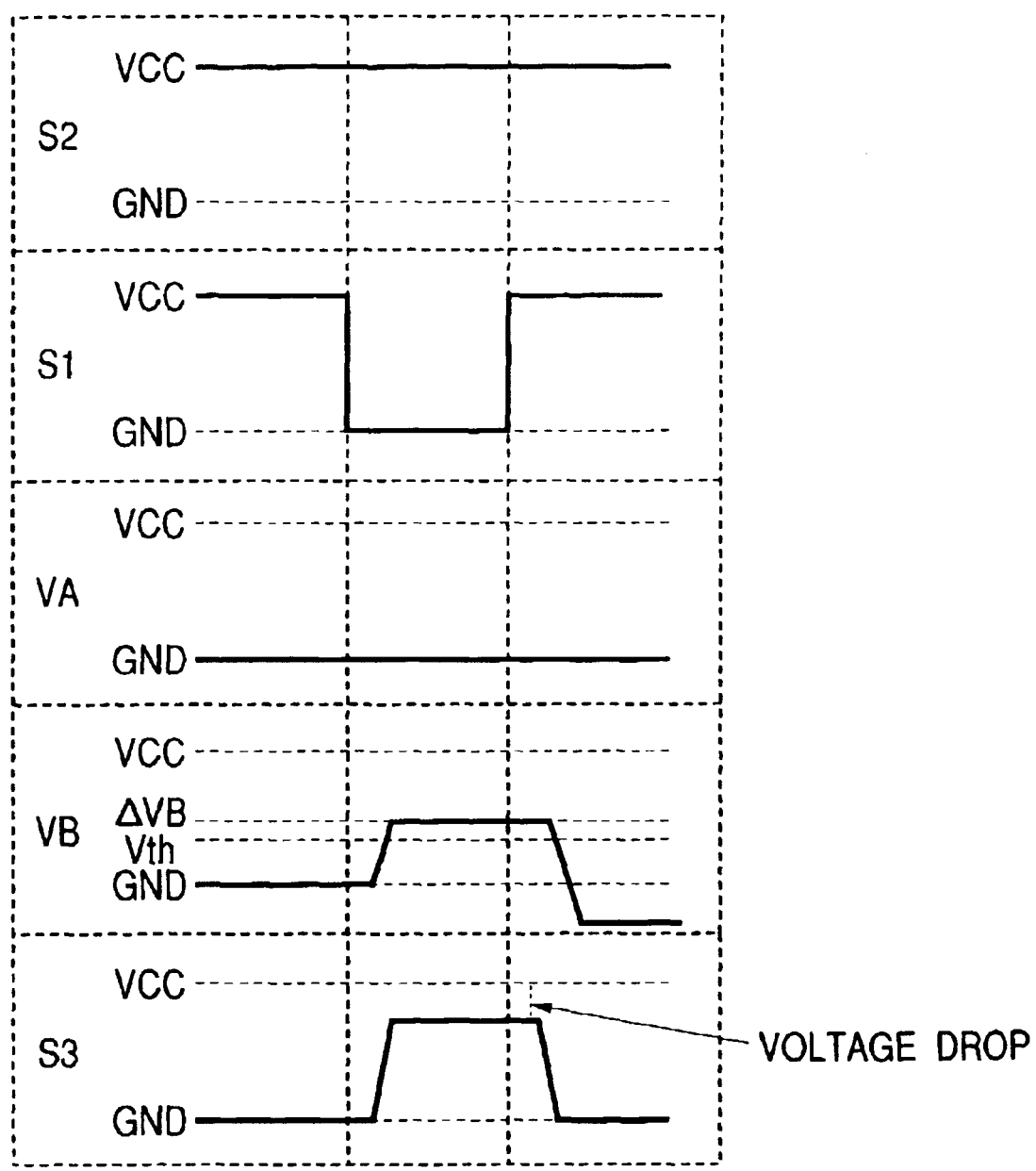
FIG. 11 is an operation waveform diagram for explaining an example of the circuit operation of FIG. 10.

FIG. 9 illustrates a block diagram of an embodiment of an information processing system of the present invention. A microcomputer chip 10 has a structure that a processor unit (CPU), a ROM unit (ROM), a RAM unit (RAM), a timer unit (TIM), an A/D converting unit (A/D), a serial communication interface unit (SCI), a data input/output circuit unit (I/O) or the like are mounted on the same semiconductor substrate. These units are connected with each other via a data bus 18A and an address bus 18B. The processor unit (CPU) is mainly formed of a central processor, a control circuit and an arithmetic operation circuit or the like. The microcomputer chip 10 formed as explained above is operated, for example, with a program stored in the ROM unit (ROM).

An EEPROM chip 20 has a structure that a serial communication interface unit (SCI) and a nonvolatile memory unit (EEPROM) or the like are mounted on the same semiconductor substrate. The serial communication interface unit (SCI) includes control logical circuits, a device address memory and a comparing circuit.

The EEPROM chip 20 includes, within a plurality of bonding pads, a bonding pad 21A for serial data (SDA) and a bonding pad 21B for serial clock (SCL) as the signal terminals. The microcomputer chip 10 includes, in a plurality of bonding pads, a bonding pad 11A for serial data (SDA) and a bonding pad 11B for serial clock (SCL) as the signal terminals.

The bonding pad 21A for SDA of the EEPROM chip 20 is electrically connected to the bonding pad 11A for SDA of the microcomputer chip 10 via the signal transfer route 25A, while the bonding pad 21B for SCL of the EEPROM chip 20 is electrically connected to the bonding pad 11B for SCL of the microcomputer chip 10 via the signal transfer route 25B.

The nonvolatile memory unit (EEPROM) of the EEPROM chip 20 is used for writing of the serial data with operation of the microcomputer chip 10. Namely, the write and read operations of the nonvolatile memory unit (EEPROM) of the EEPROM chip 20 are controlled with the control signal from the processor unit (control circuit) of the microcomputer chip 10. The signal transfer routes 25A and 25B are formed of internal leads and two bonding wires. Namely, the EEPROM chip 20 is mounted in the laminated structure on the microcomputer chip 10 and these are sealed with the same resin sealing means. Therefore, the corresponding terminals of the EEPROM chip 20 are electrically connected to the internal leads via the binding wires on the microcomputer chip 10.

Namely, electrical connection between the microcomputer chip 10 and the EEPROM chip 20 is conducted with the inner leads of lead 2 and the two bonding wires at the inside of the resin sealing means. With introduction of such structure, a lead frame which is developed in line with the microcomputer chip 10 can be used in direct. Therefore, it is no longer required to newly develop a lead frame for very kind of the microcomputer chip 10. In addition, it is neither required to develop, for every kind, the microcomputer chip 10 which is provided with the EEPROM bonding pad for electrical connection with the EEPROM chip 20.

The serial data signal is outputted from the SDA bonding pad 11A of the microcomputer chip 10 and is then inputted to the SDA bonding pad 21A of the EEPROM chip 20 via the bonding wire 16, lead 2 and bonding wire 16. Meanwhile, the serial clock signal is outputted from the SCL bonding pad 11B of the microcomputer chip 10 and is then inputted to the SCL bonding pad 21B of the EEPROM chip 20 via the bonding wire 16, lead 2 and bonding wire 16.

This embodiment is provided with a couple of EEPROM 1 and EEPROM 2. One EEPROM 1 is mounted in the laminated structure to the microcomputer chip 10 as illustrated in FIG. 14 and these are integrated in the sealing process. On the other hand, the hatched EEPROM 2 is designed as an external memory for expansion. The EEPROM 1 and EEPROM 2 are formed of the similar semiconductor chips. The EEPROM 1 is mounted in the laminated structure on the microcomputer chip 10, while the EEPROM 2 is individually formed as a semiconductor device. Such expansion EEPROM 2 is mounted on the substrate 11 as explained above and is then connected to the IIC bus. The EEPROM 2 may also be designed as the other memories such as SRAM, DRAM or as an LCD driver or the like.

The microcomputer chip 10, EEPROM 1 and EEPROM 2 or the like are provided, although not particularly restricted, with a power-on reset circuit to receive a power-on reset signal formed by this circuit, reads the IIC bus interface enable bit stored within the circuit with the control circuit SCI and then sets the readout bit to the IIC bus control register. This internally stored information may be set, for example, with ON and OFF status of a fuse or with a memory cell of the EEPROM.

In the microcomputer chip 10, it is possible to set the IIC bus interface enable bit with the reset and an initial setting operation with such power-on reset or the like. Moreover, when an idle terminal exists in each device, it is also possible to fixedly supply the high/low level signal using such terminal to set validity and invalidity of the output circuit corresponding to the IIC bus and the other output circuits.

As explained above, the present invention can provide following effects.

(1) Validation/invalidation of operations of the input/output interface circuit suitable for the bus such as the IIC bus is instructed with the control signal and an output element included in the input/output interface circuit is maintained in the OFF state without relation to voltage change at an external terminal corresponding to the input/output interface circuit in response to invalidation of operation by the control signal. Thereby, a signal can be transferred to the external terminal connected to the input/output interface circuit with the other signal output circuit.

(2) A semiconductor device of simplified structure assuring highly flexible application can be realized by connecting, to the above external terminal, an output terminal of the output circuit corresponding to the interface which is different from the input/output interface circuit suitable for the IIC bus, validating the operation of the input/output interface circuit and invalidating the operation of the output circuit when the control signal is in one level and then invalidating the operation of the input/output interface circuit and validating the operation of the output circuit when the control signal is in the other level.

(3) In addition to the above effects, variety of data can be transferred with the simplified structure by providing the IIC bus control register to the input/output interface circuit suitable for the IIC bus and then forming the control signal with the particular bits provided in the IIC bus control register.

(4) Moreover, operations of the output circuit can be guaranteed easily and stably by using, as the control circuit, a switch element which receives the control signal and supplies the fixed level corresponding to the OFF state to the input terminal of the output element.

(5) In addition, operations of the output circuit can also be guaranteed easily and stably by using, as the control circuit, a switch element which receives the control signal to cut off the signal route between the output terminal of the output element and one end of the capacitance element or between the other terminal of the capacitance element and the input terminal of the output element.

(6) Moreover, operations of the output circuit can also be guaranteed easily and stably by using, as the control circuit, a switch element which receives the control signal to terminate both terminals of a resistance element for transferring the drive signal to the input terminal of the output element.

(7) Moreover, a semiconductor device including a microprocessor which is formed in the simplified structure and can be mounted to various systems can be realized by providing an input/output interface circuit which includes a microprocessor and its peripheral circuit and suitable for the bus such as IIC bus and an output circuit corresponding to the interface which is different from the input/output interface circuit suitable for the bus such as IIC bus, providing a control circuit for maintaining the output element included in the input/output interface circuit to the OFF state by connecting the input/output terminal of the input/output interface circuit and the output terminal of the output circuit to the common external terminal, validating operations of the input/out interface circuit and invalidating operations of the output circuit when the predetermined control signal is in one level, invalidating operations of the input/output interface circuit and validating operations of the output circuit when the control signal is in the other level, and then maintaining the output element including the input/output interface circuit to the OFF state with the control circuit.

(8) Moreover, various data can be transferred with the simplified structure by providing the IIC bus control register to the input/output interface circuit suitable for the IIC bus and then forming the control signal with the particular bit provided in the IIC bus control register.

(9) In addition, operation modes can be set automatically depending on the system by setting the particular bit to the IIC bus control register with a signal which is generated when the power is turned or when the reset operation is executed.

The present invention which has been developed by the inventors of the present invention has been explained above practically based on the preferred embodiment thereof but the present invention is not limited thereto and allows various changes and modifications within the scope not departing from the claims thereof. As the other signal output circuit, any type of circuit such as CMOS output circuit may be used. As the output circuit, a bipolar transistor may also be used in addition to the MOSFET. The present invention can also be applied to various semiconductor devices mounting the interface circuit corresponding to the IIC bus.

The effects of the present invention can be explained briefly as follows. Validation or invalidation of operations of the input/output interface circuit suitable for the bus such as the IIC bus may be instructed with the control signal and an output element included in the input/output interface is maintained in the OFF state without relation to the voltage change at the external terminal corresponding to the input/output interface circuit in response to invalidation of operation with the control signal. Thereby the signal can be transferred, with the other signal output circuit, to the external terminal to which the input/output interface circuit is connected.

What is claimed is:

1. A semiconductor device, comprising:
   a first terminal;
   an output circuit which is coupled to said first terminal to provide an output signal which is limited in rate of change to said first terminal under a signal output state; and
   a control circuit,
   wherein said output circuit includes a rate of change limiting element which limits a rate of change of said output signal, and
   wherein said control circuit is structured to cancel, based on a control signal, influence of said rate of change limiting element on the rate of change of the output signal at said first terminal.

2. A semiconductor device according to claim 1,
   wherein said output circuit includes an output MOSFET having a drain which provides a signal to said first terminal,
   wherein said rate of change limiting element includes a capacitance element for limiting signal rate of change of said first terminal, and wherein said control circuit includes a switch element for canceling signal rate of change limitation by said capacitance element.

3. A semiconductor device according to claim 2,
   wherein said capacitance element is coupled between the drain and a gate of said output MOSFET, and
   wherein said switch element includes a switch MOSFET for forcibly setting the gate of said output MOSFET to a reference voltage by switching operation thereof.

4. A semiconductor device according to claim 3,
   wherein an input circuit is further provided to receive an input signal via said first terminal.

5. A semiconductor device comprising:
   an input/output interface circuit which is suitable for a bus having a serial data line and a serial clock line, and which provides, in a signal output state, an output signal, which is limited in voltage rate of change, to a corresponding terminal; and
   a control circuit for setting, in response to a control signal, an output element included in said input/output interface circuit to an OFF state without relation to voltage change of said corresponding terminal.

6. A semiconductor device according to claim 5,
   wherein said corresponding terminal is connected to an output terminal of an output circuit corresponding to an interface which is different from the input/output interface circuit suitable for said bus,
   wherein there is provided a first operating state where a signal output operation of said input/output interface circuit is validated and a signal output operation of said output circuit is invalidated, and a second operating state where the signal output operation of said input/output interface circuit is invalidated and the signal output operation of said output circuit is validated, and
   wherein said input/output interface circuit sets said output element to said OFF state with said control signal in the second operating state where operation of said output circuit is validated.

7. A semiconductor device according to claim 6,
   wherein said input/output interface circuit suitable for said bus is provided with a register to form said control signal with a particular bit set to said register.

8. A semiconductor device according to claim 7,
   wherein said register is composed of a bus control register.

9. A semiconductor device according to claim 8,
   wherein said control circuit includes a switch element which receives said control signal and supplies a fixed level, corresponding to the OFF state, to an input terminal of said output element.

10. A semiconductor device according to claim 8,
    wherein said control circuit includes a switch element which receives said control signal and shuts off a signal route between the output terminal of said output element and one terminal of a capacitance element or between another terminal of the capacitance element and the input terminal of said output element.

11. A semiconductor device according to claim 8,
    wherein said control circuit includes a switch element which receives said control signal and short-circuits both terminals of a resistance element for transferring a drive signal to the input terminal of said output element.

12. A semiconductor device on a semiconductor substrate, comprising:

a microprocessor;

peripheral circuits;

an internal data bus coupled to the microprocessor and to the peripheral circuits;

an input/output interface circuit suitable for a first bus condition, and including an output element;

an output circuit suitable for a bus condition different from that of the input/output interface circuit suitable for the first bus condition;

an external terminal to which an input/output terminal of said input/output interface circuit and an output terminal of the output circuit are coupled in common;

a control circuit through which the internal data bus is coupled to the input/output interface circuit for turning OFF the output element in the input/output interface circuit; and a register having a bit for controlling a first operating state and a second operating state, wherein the first operating state is a state in which a signal output operation of the input/output interface circuit is validated and a signal output operation of the output circuit is invalidated, and the second operating state is a state in which the signal output operation of the input/output interface circuit is invalidated and the signal output operation of the output circuit is validated, and wherein the output element is turned OFF by a control signal based on the bit of the register in the second operating state.

13. A semiconductor device according to claim 12, wherein the bit is set by a signal generated when a power is supplied or when an operation of the semiconductor device is reset.

14. A semiconductor device according to claim 13, wherein the first bus condition is suitable for a bus condition having a serial data line and a serial clock line, and wherein the register includes a bus control register controlling the first bus condition.

15. A semiconductor device according to claim 14, further comprising:

a second control circuit through which the internal data bus is coupled to the output circuit.

16. A semiconductor device according to claim 15, wherein the control signal based on the bit of the register invalidates the signal output operation of the output circuit in the first operating state.

17. A semiconductor device according to claim 12, further comprising:

a second control circuit through which the internal data bus is coupled to the output circuit, wherein operation of the second control circuit is controlled by the control signal based on the bit of the register.

18. A semiconductor device according to claim 12, further comprising:

a second control circuit through which the internal data bus is coupled to the output circuit, wherein the bit of the register is supplied to each of said control circuits.

* * * * *

UNITED STATES PATENT AND TRADEMARK OFFICE
CERTIFICATE OF CORRECTION

| | |
|---|---|
| PATENT NO. | : 6,947,335 B2 |
| APPLICATION NO. | : 10/256025 |
| DATED | : September 20, 2005 |
| INVENTOR(S) | : Hirotsugu Nakamura |

It is certified that error appears in the above-identified patent and that said Letters Patent is hereby corrected as shown below:

On the Title Page, in item (73) Assignees, change the second assignee from "Hitachi ULSI Systems Co., Ltd." to --Hitachi Hokkai Semiconductor, Ltd.--.

Signed and Sealed this

Twelfth Day of June, 2007

JON W. DUDAS
*Director of the United States Patent and Trademark Office*